(12) United States Patent
Kamm et al.

(10) Patent No.: US 7,078,135 B2
(45) Date of Patent: Jul. 18, 2006

(54) METHOD FOR PATTERNING A MASK LAYER AND SEMICONDUCTOR PRODUCT

(75) Inventors: Frank-Michael Kamm, Unterhaching (DE); Christof Matthias Schilz, München (DE)

(73) Assignee: Infineon Technologies AG, Munich (DE)

( * ) Notice: Subject to any disclaimer, the term of this patent is extended or adjusted under 35 U.S.C. 154(b) by 285 days.

(21) Appl. No.: 10/653,589

(22) Filed: Sep. 2, 2003

(65) Prior Publication Data

US 2004/0081898 A1    Apr. 29, 2004

(30) Foreign Application Priority Data

Aug. 30, 2002 (DE) ................................ 102 40 085

(51) Int. Cl.
*G01F 9/00* (2006.01)
(52) U.S. Cl. ........................................................... 430/5
(58) Field of Classification Search ..................... None
See application file for complete search history.

(56) References Cited

U.S. PATENT DOCUMENTS 6,768,124 B1 * 7/2004 Suzuki et al. ............ 250/492.2
6,883,158 B1 * 4/2005 Sandstrom et al. ........... 716/19

FOREIGN PATENT DOCUMENTS

DE    102 16 820 A1    11/2003

* cited by examiner

*Primary Examiner*—S. Rosasco
(74) *Attorney, Agent, or Firm*—Laurence A. Greenberg; Werner H. Stemer; Ralph E. Locher

(57) ABSTRACT

During the lithographic exposure of layers to be patterned on semiconductor products, use is made of masks whose mask pattern is imaged on a reduced scale, with the aid of an imaging optical arrangement, onto the layer to be patterned. After the patterning of the mask layer, a membrane is placed onto the mask with a membrane holder in order to keep dust or other contaminants in the air away from the plane of the mask layer during the exposure. When the mask and the membrane holder are mounted, manufacturing-dictated height deviations thereof lead to subsequent distortion of the mask structure of the mask layer, which is transferred to the semiconductor product by means of the lithography. Here, the height tolerances of the mask and of the membrane holder are measured and a corrected mask pattern is calculated, the mask structures of which are offset in the lateral direction such that the mask distortions resulting from the mounting of the membrane holder are compensated for. The deformations of the mask and of the membrane holder perpendicular to the mask plane are compensated for by lateral displacements of the mask structures of the corrected mask pattern.

14 Claims, 4 Drawing Sheets

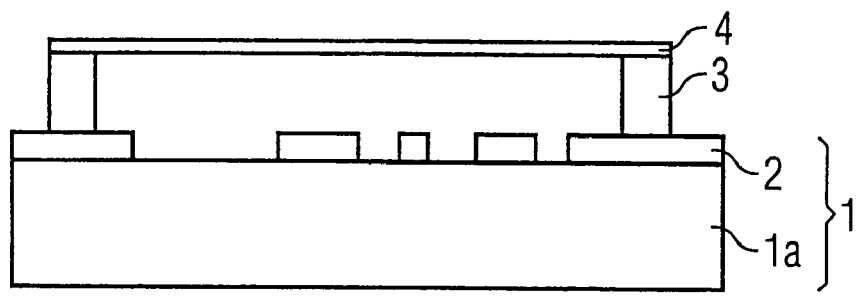
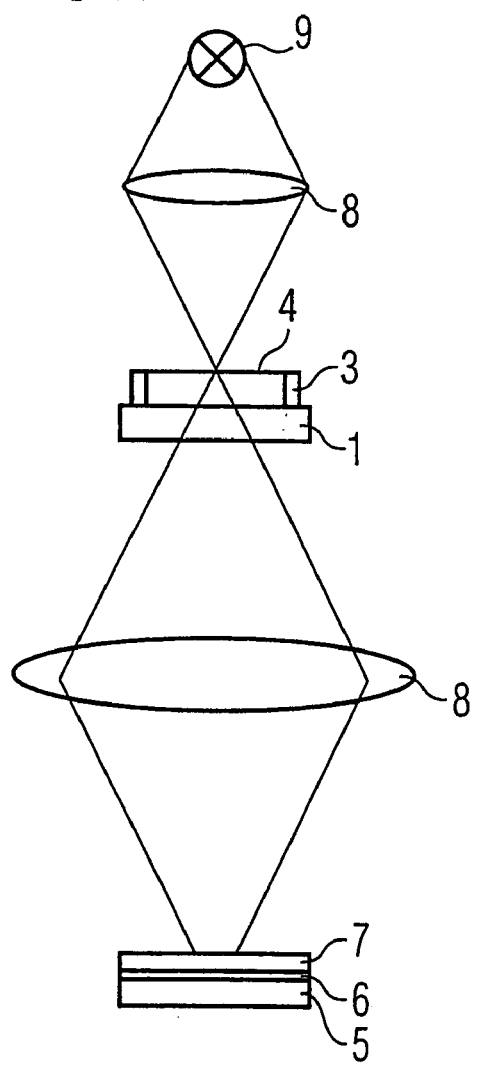

FIG 9
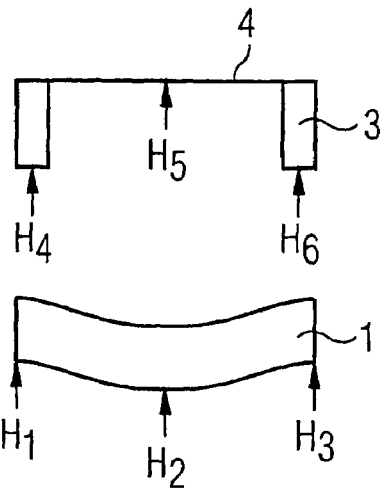
Calculation of d' for all structures of the mask pattern M1 from H1, H2, H3, H4, H5, H6 and, if appropriate, in a manner dependent on p and E
Calculation of the corrected mask pattern M2 from d' and M1
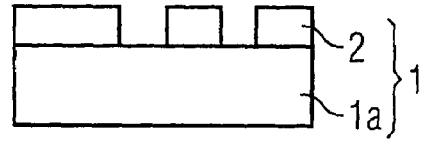
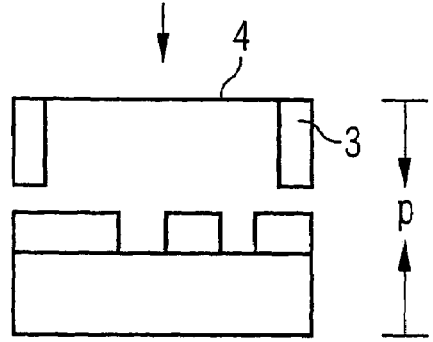
Lithographic exposure of the layer 7 of the semiconductor product 5

METHOD FOR PATTERNING A MASK LAYER AND SEMICONDUCTOR PRODUCT

BACKGROUND OF THE INVENTION

Field of the Invention

The invention relates to a method by which a mask layer of a mask is patterned. The method, in general terms, includes the following steps:

a mask with a mask layer, a membrane and a membrane holder are provided, the membrane holder being able to be mounted on the mask in order to protect the mask layer from contaminants by way of the membrane during a patterning of a layer of a semiconductor product;

an ideal mask pattern is prescribed; and the mask layer is patterned by transferring a mask pattern to the mask layer.

The invention furthermore relates to a semiconductor product with a patterned layer.

In semiconductor manufacturing, layers are patterned by lithographic processes in which a photosensitive layer is applied to that layer of the semiconductor product which has to be patterned, and is exposed using an already patterned mask, whereby the structure of the mask is transferred to the photosensitive layer, generally a resist layer. The exposed photosensitive layer is developed and used for its part as a mask for an etching process in which the structure of the developed photosensitive layer is transferred to that layer of the semiconductor product which has to be patterned.

The mask used to develop the photosensitive layer has a mask layer which has already been patterned and which serves as a transmission mask or as a reflection mask for the lithographic exposure process. The structure of the mask layer corresponds to the desired structure of that layer of the semiconductor product which has to be patterned, but has larger lateral dimensions and is imaged on a reduced imaging scale onto the photosensitive layer during the lithographic exposure.

During the lithographic exposure, the pre-patterned mask layer of the mask is arranged in an intermediate image plane so that the image plane corresponds to the position of the photosensitive layer on that layer of the semiconductor product that has to be patterned. The intermediate image plane is a sharpness plane, so that structures arranged in this plane, in particular structures of the already patterned mask layer, insofar as is permitted by the optical imaging accuracy, are imaged sharply onto the image plane at the level of the photosensitive layer. Although sharp imaging of structures within the sharpness plane of the patterned mask layer is desirable insofar as artificially formed structural elements are imaged, contaminants such as dust, for example, are also imaged with the same imaging accuracy if they end up in the sharpness plane, that is to say directly on the mask layer.

For this reason, masks are covered with a membrane which is mounted on the mask, on one side of the latter, with the aid of a membrane holder, a frame. The membrane is impermeable to dust or other small particles, so that the latter can be deposited only on the membrane, but not on the patterned mask layer of the mask. Since the membrane is spaced apart from the patterned mask layer in accordance with the frame height of the membrane holder, dust particles deposited on the membrane are situated outside the sharpness plane and are not imaged onto the photosensitive layer of the semiconductor product during the optical exposure. The disturbing influence of air contaminants in the atmosphere surrounding the mask is thereby avoided.

The membrane, also called a pellicle, conventionally comprises a thin elastic polymer film, recently also an inorganic material largely torsionally rigid such as calcium fluoride, for example. Such "hard pellicles," in the same way as the polymer-containing membranes, are arranged above the mask before the photosensitive layer of the semiconductor product is patterned lithographically. The membrane is necessary during this lithographic exposure process but not actually during the patterning of the mask layer of the mask itself. By way of example, the chromium-containing mask layer is patterned with the aid of an electron beam writer and the membrane holder with the membrane is subsequently placed onto the mask in order to transfer the structure of the mask layer to the photosensitive layer of the semiconductor product on a reduced imaging scale.

Since the membrane has a higher density than air and therefore has a larger refractive index, during the lithographic exposure through the membrane there arises a certain optical distortion which is radially symmetrical and can therefore be compensated by means of a slightly altered imaging scale. Further corrections are generally not performed.

During the production of such a mask, which has a mask substrate and a mask layer to be patterned, and also during the production of the membrane holder (or of the pellicle frame), there are manufacturing tolerances which have the effect that the area regions of the mask and of the membrane holder which are intended to make contact with one another are not completely planar. Therefore, when the mask and the membrane holder are joined together, torsions arise whereby the structural elements of the patterned mask layer no longer lie exactly in one plane. As a result, it is not possible to arrange all the structural elements of the mask layer in the plane during the lithographic exposure with the aid of the mask provided with the membrane holder and the membrane, so that some structural elements are imaged in laterally distorted and/or displaced fashion on account of the optical projection. Such distortions are conventionally minimized by reducing the manufacturing tolerances during the production of the mask and the membrane holder. However, a certain distortion remains which reduces the process window for other production tolerances. If a largely torsionally rigid membrane made of an inorganic material is used, the distortions are also influenced by manufacturing tolerances and deformations of the membrane itself, since the latter is mounted on the membrane holder and height tolerances of the membrane holder cause deformations of the membrane. The membrane, which no longer runs in planar fashion, has different deflections of passing light beams in different area regions.

SUMMARY OF THE INVENTION

It is accordingly an object of the invention to provide a method of patterning a mask layer and a semiconductor product which overcomes the above-mentioned disadvantages of the heretofore-known devices and methods of this general type and which provides a mask that can be used independently of the height tolerances of the mask and of the membrane holder to be mounted thereon for a distortion-free lithographic imaging for the purpose of patterning a layer of a semiconductor product.

With the foregoing and other objects in view there is provided, in accordance with the invention, a CLAIM 1 method for patterning a mask layer of a mask, which comprises:

providing a mask with a mask layer, a membrane holder for mounting on the mask, and a membrane for protecting the mask layer from contaminants during a patterning of a layer with the mask;

prescribing an ideal mask pattern;

measuring height tolerances of the mask and the membrane holder in regions of contact therebetween in a mounted state;

calculating lateral distortions of the ideal mask pattern arising during a mounting of the membrane holder on the mask on account of the height tolerances;

transferring a corrected mask pattern onto the mask layer, the corrected mask pattern having compensation corrections relative to the ideal mask pattern, the compensation corrections compensating for the lateral distortions arising during the mounting of the membrane holder on the mask on account of the height tolerances; and patterning the mask layer with the corrected mask pattern.

In other words, the objects are achieved according to the invention by virtue of the fact that, in the method:

height differences or tolerances exhibited by the mask and the membrane holder in regions in which they make contact in the mounted state are measured before the patterning of the mask layer, that lateral distortions of the ideal mask pattern are calculated, which arise during the mounting of the membrane holder on the mask on account of the height tolerances, and that a corrected mask pattern, which has compensation corrections with respect to the ideal mask pattern, said compensation corrections compensating for the lateral distortions which arise during the mounting of the membrane holder on the mask on account of the height tolerances, is transferred to the mask layer.

According to the invention, instead of the ideal mask pattern, a distorted mask pattern is transferred into the mask layer to be patterned. The mask pattern distorted according to the invention does not correspond to the desired mask pattern with which the photosensitive layer of the semiconductor product is intended to be patterned. The mask pattern of the mask layer that is distorted according to the invention is distorted, however, in such a way that during the lithographic exposure with the aid of the distorted mask, as soon as the membrane holder is mounted on the mask, the desired mask pattern is formed on the photosensitive layer. The compensation corrections are lateral counter corrections, preferably displacements, rotations or distortions of structural elements of the mask layer which run and vary locally within the plane of the mask layer, that is to say in the lateral direction. The compensation corrections are preferably lateral displacements of lateral edges of structural elements of the ideal mask pattern which result in a corrected mask pattern.

According to the invention, the lateral compensation corrections of the mask pattern are determined from the vertical height deviations of the mask and of the membrane holder, that is to say height deviations existing in the direction perpendicular to the plane of the mask layer. The height tolerances are converted into lateral compensation corrections of the mask structures in a manner dependent on the measured height tolerances of an individual membrane holder and of an individual mask. If the same membrane holder on whose height tolerances the compensation corrections of the mask pattern have been calculated is mounted on the mask during the lithographic exposure, the mask with the mask pattern of the mask layer that is distorted according to the invention leads to the imaging of the ideal mask pattern on the photosensitive layer of the semiconductor product. Although, as a rule, a specific mask and a specific membrane holder can be measured individually independently of one another in order to determine their height tolerances, they remain assigned to one another since the lateral compensation corrections of the mask layer according to the invention are calculated from the height tolerances of said specific mask and said specific membrane holder.

Complicated elimination of height tolerances at the mask or the membrane holder can therefore be dispensed with. The compensation corrections which are calculated according to the invention, and by which the corrected mask pattern differs from the ideal mask pattern, are manifested in the structures of the corrected mask pattern being distorted and/or displaced within the plane of the mask layer in the lateral direction such that, after the mounting of the membrane holder, during the lithographic exposure, the ideal, undistorted mask pattern is generated in the photosensitive layer of the semiconductor product. Deformations of the mask and of the membrane holder perpendicular to the mask plane are compensated for according to the invention by lateral displacements of the mask structures of the corrected mask pattern.

In accordance with a preferred embodiment of the invention, the height tolerances are measured on a respective side of the mask and of the membrane holder in the vicinity of the edge. The membrane holder is generally a rectangular frame which fixedly holds the membrane at its edge and is also mounted at the edge of the top side of the mask. The optical intermediate image field in which the mask layer of the mask is patterned is situated within the frame. The bearing area between the membrane holder and the mask is therefore arranged in the edge region, and here there is preferably the opportunity to effect measurement of the height tolerances of the mutually facing areas of the mask and of the membrane holder. During the mounting process, for example pressing-together and simultaneous adhesive bonding, the unevenness of said bearing areas have the effect that the mask and the membrane holder together with the membrane are deformed. This deformation takes place primarily perpendicular to the plane of the mask film of the mask, but secondly also parallel to the plane of the mask film, that is to say in the lateral direction. Therefore, according to the invention compensation corrections of the mask structure are performed in the lateral direction in order that structural elements lying outside the envisaged mask plane can be imaged into the photosensitive layer of the semiconductor product in a positionally accurate and undistorted manner.

In accordance with an additional feature of the invention, the height tolerances are measured at corner regions of the mask and of the membrane holder. In addition, it may be provided that the height tolerances are measured at a plurality of locations along the edges of the mask and of the membrane holder, preferably in the region of the edge centers of the mask and of the membrane holder. A measurement both in the region of the corners and in the region of the edge centers enables height differences to be taken into account at relatively low cost and in a manner that manages with just a small number of measurement points. Refinements of the lateral correction of the mask pattern according to the invention can easily be achieved by increasing the number of measurement points which are arranged in the region of the bearing area of the membrane holder of the mask, that is to say on the mask layer. The bearing areas are those areas in which the mask and the membrane holder are intended to make contact or intended to be fixed to one another by means of an adhesive or some other adhering material.

In accordance with another feature of the invention, the compensation corrections of the corrected mask pattern are calculated in a manner dependent on the magnitude of the contact pressure with which the membrane holder is mounted on the mask. The adhesive-bonding pressure or contact pressure when the membrane holder is connected to the mask influences the deformations of mask and membrane holder (and of the membrane), so that the lateral compensation corrections which are optimal for the corrected mask pattern can be calculated even more precisely.

In accordance with a further feature of the invention, a torsionally rigid membrane made of an inorganic material is used as the membrane. In the case of materials having a high modulus of elasticity the method according to the invention leads to significant improvements in the imaged mask structures since the strains of the membrane which arise when the membrane is mounted on the membrane holder can also be compensated for by the lateral compensation correction. Suitable membrane materials are preferably calcium fluoride in amorphous form; the thickness of such a membrane is typically in the region of a few μm. This means that the lithography ranging below 248 nm, 193 nm and 157 nm, for which no transparent polymer layers exist, can also be improved by the method according to the invention.

Accordingly, it is preferably provided that the compensation corrections of the corrected mask pattern are calculated in a manner dependent on elastic properties of the membrane. In particular, the membrane thickness, the modulus of elasticity of the membrane material and the strains of the membrane which are brought about through the contact between the membrane and the membrane holder can influence the calculation of the compensation corrections of the corrected mask pattern.

In accordance with again an added feature of the invention, the compensation corrections are lateral displacements within the plane of the mask layer by which the edges of structures of the ideal mask pattern are displaced. This gives rise to the mask pattern corrected according to the invention, the distortions of which mask pattern are compensated for during lithographic exposures through the presence of the mounted membrane holder. As a result, the ideal, undistorted mask pattern is produced on the light-sensitive layer of the semiconductor product.

The compensation corrections are, in particular, non-rotationally symmetrical distortion corrections of the corrected mask pattern. Such corrections cannot be canceled by the conventionally used alteration of the imaging scale and therefore constitute a new quality of the imaging accuracy.

The corrected mask pattern is preferably transferred to the mask layer of the mask with the aid of an electron beam writer. The mask layer is thereby patterned. The mask layer is preferably a chromium layer.

In accordance with a concomitant feature of the invention, the membrane holder with the membrane is mounted on the mask, and that a layer of a semiconductor substrate is patterned lithographically with the aid of the mask prepared in this way. The layer patterned in this way contains a demagnified image of the ideal, undistorted mask pattern, even though the exposure has been carried out with the aid of a distorted mask pattern and with the aid of a distorting geometry of mask, membrane holder and membrane. Even under such conditions, the layer of the semiconductor product is patterned with higher precision by means of the lateral compensation correction which is calculated according to the invention and transferred to the mask layer. Any desired layer of a semiconductor product can be patterned by the method according to the invention.

Other features which are considered as characteristic for the invention are set forth in the appended claims.

Although the invention is illustrated and described herein as embodied in a method for patterning a mask layer and semiconductor product, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a side elevation of a mask with a mounted membrane holder;

FIG. 2 is a diagrammatic construction of an apparatus for the lithographic exposure of a semiconductor product with the aid of a mask with a mounted membrane holder;

FIG. 9 is a diagrammatic sequence of a method according to the invention.

DESCRIPTION OF THE PREFERRED EMBODIMENTS

Figure 3:
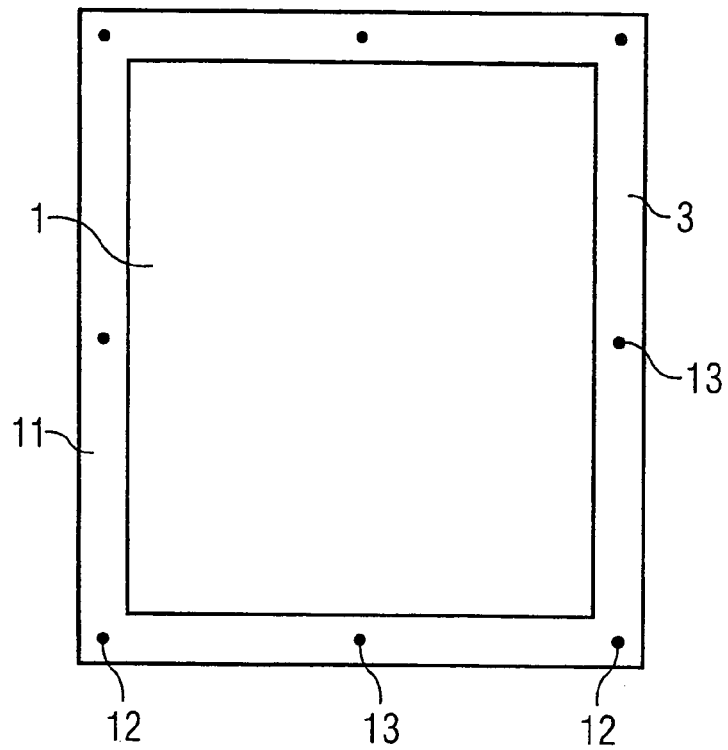
FIG. 3 is a plan view of a mask with a mounted membrane holder.

Referring now to the figures of the drawing in detail and first, particularly, to FIG. 1 thereof, there is shown a mask 1 with a mask substrate 1a and a mask layer 2. A membrane 4 is mounted on the mask with the aid of a membrane holder 3. The mask layer 2 is already patterned; the membrane 4 (pellicle) serves to keep dust or other contaminants away from the plane of the mask layer 2 during the lithographic exposure.

An apparatus for lithographic exposure is illustrated diagrammatically in FIG. 2. With the aid of a UV light source 9 and an imaging optical arrangement 8, the structure of the mask layer 2 of the mask 1 with membrane holder 3 having been mounted is imaged on a reduced imaging scale onto a layer of a semiconductor product 5. The layer to be patterned is covered with a photosensitive layer 7, for instance a resist layer, which is exposed lithographically and then developed. Afterwards, by means of an etching process the structure of the layer 7 is transferred to the layer 6 of the semiconductor product 5 that is to be patterned.

Figure 4:
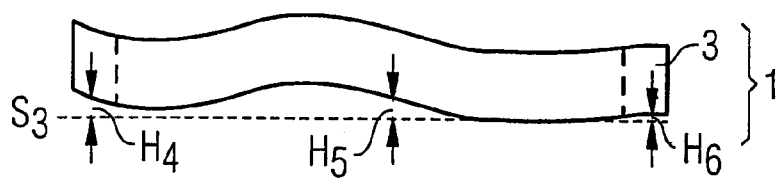
FIG. 4 is a diagrammatic side view of a membrane holder.
Figure 5:
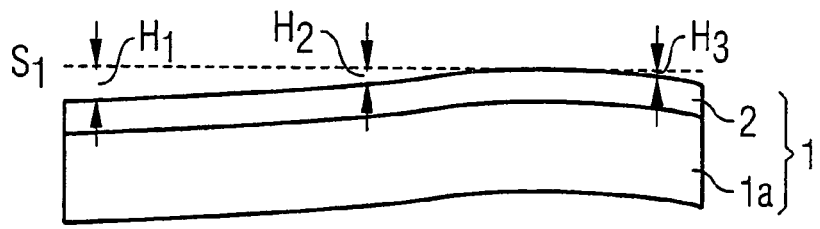
FIG. 5 is a diagrammatic side view of a mask.

The assembly comprising mask 1, membrane holder 3 and membrane 4 as illustrated in FIG. 1 is illustrated in plan view in FIG. 3. The bearing area of the membrane holder 3 can be discerned at the edge of the mask 1, which bearing area surrounds that region of the mask layer 2 which is to be patterned. The membrane holder 3 and the mask 1 are respectively illustrated individually in FIGS. 4 and 5, in side view. These Figs. show, on an exaggerated large scale height tolerances (height differences) H1, H2, H3, H4, H5, H6 of the mask 1 and of the membrane holder 3, said height tolerances being dictated by the manufacturing; said height tolerances specify the deviation from an imaginary exactly planar plane S3, S1 of the underside of the membrane holder 3 and of the top side of the mask 1. If the areas S3, S1 of the membrane holder and of the mask which are illustrated in FIGS. 4 and 5 are brought into contact, as illustrated in FIG. 1, then the height tolerances give rise to deformations of the mask 1 and of the membrane holder 3 including the membrane 4, whereby structures of the mask pattern of the mask layer 2 are displaced primarily perpendicular to the plane of the mask layer 2, but secondly also parallel to the mask layer 2, that is to say in the lateral direction. This results in a distortion of the mask pattern of the mask 1 when the membrane holder 3 has been mounted the mask 1. During the lithographic imagining, said distortions lead to imaging errors which reduce the process window.

Figure 6:
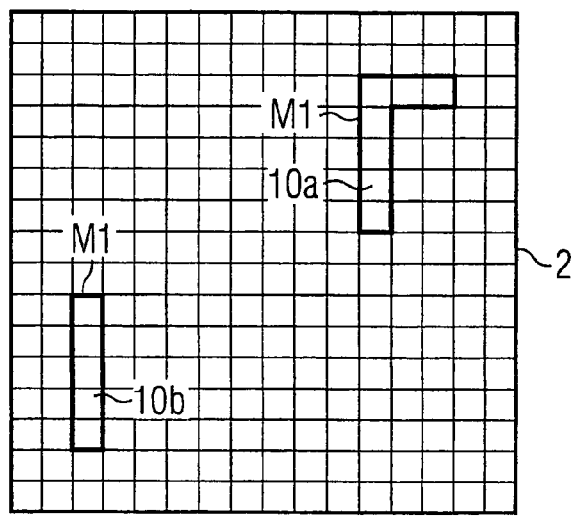
FIG. 6 is an ideal mask pattern of a mask layer.
Figure 7:
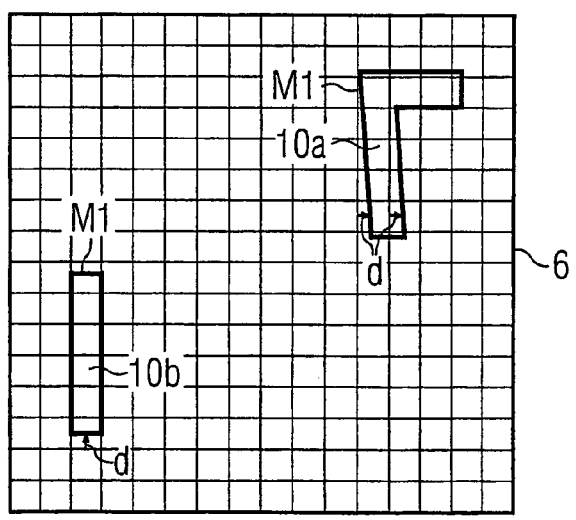
FIG. 7 is a pattern of a patterned layer of a semiconductor product, which pattern is produced with the aid of the mask in FIG. 6.
Figure 8:
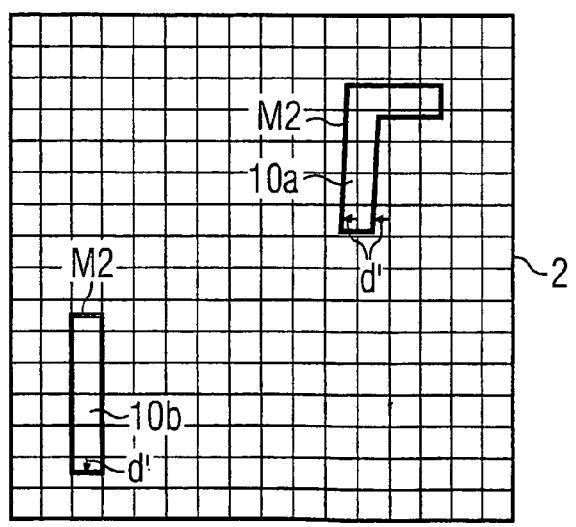
FIG. 8 is a mask pattern of the mask layer which is corrected according to the invention.

FIGS. 6 to 8 diagrammatically show the effects of the lateral distortions resulting from the height tolerances H1, H2, . . . , H6 using the example of a mask pattern. FIG. 6 shows an ideal mask pattern M1 of the mask layer 2, the illustration showing, by way of example, two structures 10a, 10b and their arrangement in the plane of the mask layer 2 being illustrated by a background grid. If a mask with this mask pattern is used for lithographic exposure as illustrated in FIG. 2, ideally an identical pattern merely reduced in size (as illustrated in FIG. 6) arises on the photosensitive layer 7 as well and, as a consequence, also in the layer 6 of the semiconductor product 5 that is to be patterned.

In practice, however, the distorted mask structure M' illustrated in FIG. 7 is observed in the patterned layer 6 of the semiconductor product 5. The size of the mask structure illustrated in FIG. 7 does not correspond in practice to the size of the structure from FIG. 6; it has been illustrated in the same size only in order to be able to better compare the two structures. FIG. 7 reveals that the structures 10a and 10b of the mask pattern M' are in each case displaced, rotated and generally distorted by lateral distortions d, as can be discerned from the position of the structures 10a and 10b relative to the background grid. These distortions arise because the membrane 4 and the membrane holder 3 are fixed to the mask 1 during the lithographic patterning and because height tolerances of the mask 1, of the membrane holder 3 and/or of the membrane 4 lead to deformations of the mask layer 2, whereby the lateral positions of the edges of mask structures 10a and 10b are altered.

According to the invention, the underlying height tolerances are measured and the lateral distortions d arising from said height tolerances are calculated, and a corrected mask pattern is transferred into the mask layer instead of the ideal mask pattern, thereby compensating for the deformation-dictated distortions.

The mask layer 2 has a structure, that is to say a mask pattern M2, whose mask structures 10a, 10b are displaced and deformed by precisely calculated lateral corrections d' precisely such that, as soon as the membrane holder is mounted onto the mask 1 with the mask layer 2 patterned in this way, a demagnified image of the ideal mask pattern M1, as is illustrated in FIG. 6, is produced during the lithographic exposure on the semiconductor product 5. The distortions d of the mask pattern M' which are illustrated in FIG. 7, and are conventionally observed on the semiconductor product 5, are compensated for by the counter correction according to the invention. FIG. 8 shows, in particular, that the lower limb of the mask structure 10a is displaced toward the left in order to compensate for the displacement toward the right which is illustrated in FIG. 7. Equally, in FIG. 8 the mask structure 10b is displaced downward relative to the position in the ideal mask structure M1 in FIG. 6 in order to compensate for the upward displacement of the image structure 10b as illustrated in FIG. 7.

FIG. 9 diagrammatically shows the sequence of the method according to the invention in the form of a flow diagram. Firstly, height tolerances H1, H2, H3, H4, H5, H6 of the mask 1, of the membrane holder 3 and, if appropriate, also of the membrane 4 are measured. This information is used to calculate the expected distortions d and the compensation corrections d' of the corrected mask pattern M2 according to the invention that are accordingly necessary. The calculation, which is executed by means of corresponding software and/or hardware, may be effected for example in such a way that firstly, for a predetermined mask structure M1 constituting an ideal structure, the compensation corrections d' required for each mask structure 10a and 10b are calculated. These result from the height deviations H1, H2, . . . , H6, in which case the pressure p with which the membrane holder 3 is fixed to the mask 1 and elastic properties of the membrane 4, for example modulus E of elasticity, may preferably also be taken into account. The displacement of the edges of the structures 10a, 10b of the ideal mask pattern M1 by the calculated corrections d' produce the corrected mask pattern M2. The mask layer 2 is patterned, according to the invention, with this corrected mask pattern M2 and consequently has a structure corresponding to said pattern M2. The membrane holder 3 is mounted onto the mask 1 patterned with the corrected mask pattern M2. The same membrane holder 3 whose height deviations were measured beforehand and were taken as a basis for the calculation of the compensation corrections d' of the corrected mask pattern M2 is mounted in this case. The membrane holder 3 is mounted on the mask 1 with the mounting pressure p which, if appropriate, was likewise taken as a basis for the calculation. The mask 1 with the mounted membrane holder 3 is subsequently used to expose a layer 6 of the semiconductor product 5, as illustrated in FIG. 2. It is generally the case here that firstly a light-sensitive resist layer 7 is patterned, the structure of which is then transferred to the layer 6 to be patterned.

Further parameters beside the height tolerances H1, . . . , H6, the mounting pressure p and the modulus E of elasticity of the membrane may also be taken as a basis in the calculation of the lateral corrections of the corrected mask pattern M2. The calculation may also be effected in a manner dependent on further parameters, for example in a manner dependent on the arrangement, the density and the size of the bright-field portions of the patterned mask layer 2. In regions of large-area bright-field portions, in which the mask layer 2 is removed, the mask has a higher deformability, which can be taken into account in the calculation of lateral corrections. The calculation itself can be carried out with the aid of mathematical approximation methods, for instance with the aid of the finite elements method, or else by empirical comparison with test mask structures or other comparison mask structures. A multiplicity of mask structures may be stored in a database and provided for comparison purposes in order to compare the calculated corrections of the corrected mask pattern for control purposes. The electron beam writer used to transfer mask patterns to the mask layer 2 is controlled, according to the invention, in accordance with this precorrection and therefore transfers the corrected mask pattern M2 instead of the ideal mask pattern M1. The mask 1 patterned in this way is inserted, with membrane holder 3 having being mounted, into the arrangement for the lithographic exposure of the semiconductor product.

The method according to the invention may preferably be used for lithographic methods in the UV region with lengths below 248, 193 and 157 nm. Particularly in the case of membranes which comprise a rigid thin layer instead of the polymer films (hard pellicle), significant reductions of the mask distortions are achieved since both strains and curvatures of the pellicle and of the pellicle frame can be compensated for. The improved lithographic patterning enlarges the process window for the production of the layer 6 to be patterned on the semiconductor substrate 5. The data correction according to the invention, in which lateral compensation corrections are performed in a targeted manner depending on height deviations H1, . . . , H6, the mounting pressure p, the elastic properties of the membrane and/or the density, distribution and arrangement of the bright-field regions of the mask layer, leads to a larger leeway for other error sources in the production of semiconductor products.

We claim:

1. A method for patterning a mask layer of a mask, which comprises:
    providing a mask with a mask layer, a membrane holder for mounting on the mask, and a membrane for protecting the mask layer from contaminants during a patterning of a layer with the mask;
    prescribing an ideal mask pattern;
    measuring height tolerances of the mask and the membrane holder in regions of contact therebetween in a mounted state;
    calculating lateral distortions of the ideal mask pattern arising during a mounting of the membrane holder on the mask on account of the height tolerances; and
    transferring a corrected mask pattern onto the mask layer, the corrected mask pattern having compensation corrections relative to the ideal mask pattern, the compensation corrections compensating for the lateral distortions arising during the mounting of the membrane holder on the mask on account of the height tolerances, thereby patterning the mask layer with the corrected mask pattern.

2. The method according to claim 1, which comprises measuring the height tolerances on a respective side of the mask and of the membrane holder in a vicinity of an edge thereof.

3. The method according to claim 1, which comprises measuring the height tolerances at corner regions of the mask and of the membrane holder.

4. The method according to claim 1, which comprises measuring the height tolerances in a region of edge centers of the mask and of the membrane holder.

5. The method according to claim 1, which comprises calculating the compensation corrections of the corrected mask pattern in dependence on a magnitude of a contact pressure with which the membrane holder is mounted on the mask.

6. The method according to claim 1, which comprises providing a torsionally rigid membrane made of an inorganic material as the membrane.

7. The method according to claim 6, which comprises calculating the compensation corrections of the corrected mask pattern in dependence on elastic properties of the inorganic material of the membrane.

8. The method according to claim 1, which comprises defining the compensation corrections as lateral displacements within a plane of the mask layer by which edges of structures of the ideal mask pattern are displaced.

9. The method according to claim 1, wherein the compensation corrections of the corrected mask pattern are non-rotationally symmetrical distortion corrections.

10. The method according to claim 1, which comprises transferring the corrected mask pattern to the mask layer with an electron beam writer.

11. The method according to claim 1, wherein the mask layer is a chromium layer.

12. The method according to claim 1, which comprises mounting the membrane holder with the membrane on the mask, and lithographically patterning a layer of a semiconductor substrate with the mask thus prepared.

13. The method according to claim 1, which comprises, subsequently to the patterning step, lithographically exposing a layer of a semiconductor product through the mask with the corrected mask pattern.

14. In a semiconductor product manufacturing process, a method of patterning a layer of the semiconductor product, which comprises:
    patterning a mask with the method according to claim 1; and
    exposing and patterning the layer of the semiconductor product through the mask having the corrected mask pattern.

* * * * *